(12) United States Patent
Tse et al.

(10) Patent No.: US 10,170,401 B2
(45) Date of Patent: Jan. 1, 2019

(54) INTEGRATED POWER MODULE

(71) Applicant: Mosway Technologies Limited, Tsuen Wan, Hong Kong (CN)

(72) Inventors: Celement Chiu Sing Tse, Hong Kong (CN); Peter On Bon Chan, Hong Kong (CN); Chi Keung Tang, Hong Kong (CN)

(73) Assignee: Mosway Technologies Limited, Tsuen Wan, Hong Kong (CN)

( * ) Notice: Subject to any disclaimer, the term of this patent is extended or adjusted under 35 U.S.C. 154(b) by 72 days.

(21) Appl. No.: 15/210,949

(22) Filed: Jul. 15, 2016

(65) Prior Publication Data

US 2017/0018488 A1 Jan. 19, 2017

Related U.S. Application Data

(60) Provisional application No. 62/192,622, filed on Jul. 15, 2015.

(51) Int. Cl.
*H01L 23/495* (2006.01)
*H01L 23/31* (2006.01)
*H01L 21/56* (2006.01)
*H01L 23/367* (2006.01)
*H01L 23/373* (2006.01)

(52) U.S. Cl.
CPC ........ *H01L 23/49575* (2013.01); *H01L 21/56* (2013.01); *H01L 23/3107* (2013.01); *H01L 23/3677* (2013.01); *H01L 23/3735* (2013.01); *H01L 23/49531* (2013.01); *H01L 23/49562* (2013.01); *H01L 23/49551* (2013.01); *H01L 2224/48139* (2013.01); *H01L 2224/48247* (2013.01); *H01L 2224/49111* (2013.01); *H01L 2924/181* (2013.01)

(58) Field of Classification Search
CPC ............... H01L 23/49575; H01L 21/56; H01L 23/3107; H01L 23/3735; H01L 23/49562; H01L 2224/48139
See application file for complete search history.

(56) References Cited

U.S. PATENT DOCUMENTS 9,468,087 B1 * 10/2016 Joshi .................... H05K 1/0209

* cited by examiner

*Primary Examiner* — Elias M Ullah
(74) *Attorney, Agent, or Firm* — Leydig Voit and Mayer

(57) ABSTRACT

An integrated power module comprising a power board including at least one power switching device, a driver board including at least one driver for driving a gate of the at least one power switching device, and an interconnection extending across the power board and the driver board mechanically connecting the power board and the driver board together. Included are a lead frame to which the power board and the driver board are mounted, and a package encapsulating the power board and the driver board mounted on the lead frame. Also disclosed is a method for manufacturing the integrated power module.

9 Claims, 5 Drawing Sheets

INTEGRATED POWER MODULE

The present invention relates to an integrated power module (IPM) and manufacturing method thereof.

BACKGROUND OF THE INVENTION

Reference is initially made to FIGS. 1 to 4 of the drawings. Integrated power modules (IPM) are, as is generally known in the art, composed of various circuit components including, in particular, power switching devices 10, reverse current circulating diodes 20, a gate driver IC(s) 30 and associated discrete components 40. In a typical construction of the prior art IPM, the power switching devices 10 (typically IGBT or MOSFET) and the reverse current circulating diodes 20 are supported on a ceramic substrate 100, forming a first unit. The gate driver IC(s) 30 and associated discrete components 40 are supported on a printed circuit board (PCB) 200, forming a second unit.

The ceramic substrate 100 (typically aluminium oxide) includes direct bond copper (DBC) 110 and 120 on both sides, with the copper 110 on a first side bearing an etched pattern to provide mounting pads and connections for the power switching devices 10 and the reverse current circulating diodes 20, and the copper 120 on the opposite second side exposed and acting as a heat sink. The power switching devices 10 and the reverse current circulating diodes 20 are in naked die form and are die attached to the ceramic substrate 100, with their substrate sides attached to the DBC copper 110 on the ceramic substrate 100 to produce a power board P, that being the said first unit.

The printed circuit board or PCB 200 is typically provided by a FR4 substrate. The gate driver IC(s) 30 is in the form of a naked die(s) or packaged IC(s), and so are the associated discrete components 40. They are surface mounted on the PCB 200 and are processed with normal electronic manufacturing process to produce a driver board or driver PCBA Q, that being the said second unit.

These two units are then transferred and mounted on to a lead frame 70, where they are electrically connected with their circuit components interconnected by electrical connections typically making use of bond wires 50, such as bond wires 51 between the power switching devices 10 and the reverse current circulating diodes 20 on the power board P, bond wires 52 between the power board P and the driver PCBA Q, and bond wires 53 between the power board P and the connection pins 71 on the lead frame 70. Further connection from the gate driver IC(s) 30 to the PCB 200 is needed where the gate driver IC(s) 30 is in the form of a naked die(s).

The two said connected/bonded units on the lead frame 70 are subsequently transferred to a packaging station where they are encased in a semiconductor package 60, with the connection pins 71 extending from the lead frame 70 finally trimmed and formed to complete the production of the IPM (integrated power module).

As is generally known in the art, the power board P and the driver PCBA Q are first mounted on the lead frame 70 for support before electrical interconnections are made through the use of bond wires 50. This bonding process often requires a relatively large number of bonding operations and may involve bond wires of different materials and sizes. This leads to compromise in reliability.

In addition, and of more concern, the fragile bond wires 52 bridging across the power board P and the driver PCBA Q are prone to damage (i.e. breaking) if they are made before, and when, the two interconnected units are transferred to the lead frame 70 for mounting thereon.

As a further problem or shortcoming, it is impossible to perform electrical tests on the IPM circuit prior to moulding of the semiconductor package 60 because all connection pins 71 are uncut and hence short circuited in the lead frame 70 before the lead frame 70 is trimmed and formed to bring about the connection pins 71. This leads to lowering of yield.

The subject invention seeks to mitigate or at least to alleviate these problems or shortcomings by providing a new or otherwise improved integrated power module (IPM) and manufacturing method thereof.

SUMMARY OF THE INVENTION

According to a first aspect of the invention, there is provided an integrated power module comprising a power board including at least one power switching device, a driver board including at least one driver for driving a gate of said at least one power switching device, and an interconnection across the power board and the driver board at least mechanically connecting the power board and the driver board together. Included are a lead frame to which said at least mechanically connected power board and driver board are mounted, and a package moulded upon said at least mechanically connected power board and driver board mounted on the lead frame.

Preferably, the power board includes a substrate which is of a thermally conducting and electrically insulating material, and is provided with direct bond copper, and the driver board includes a printed circuit board, at least one of the direct bond copper and the printed circuit board providing the interconnection.

In a preferred embodiment, the printed circuit board provides the interconnection and includes at least one aperture in which the or a respective substrate is located.

More preferably, the direct bond copper covers over and extending beyond said at least one aperture.

In a preferred embodiment, the direct bond copper extends from the substrate to reach and is connected with the printed circuit board, thereby providing the interconnection.

In a preferred embodiment, the integrated power module includes a flexible flat connector, such as a flexible PCB or flat cable, which provides the interconnection mechanically connecting the power board and the driver board and electrically connecting components on the power board and the driver board.

The thermally conducting and electrically insulating material may comprise ceramic material.

According to a second aspect of the invention, there is provided a manufacturing method for manufacturing an integrated power module, comprising:

providing a power board including at least one power switching device;

providing a driver board including at least one driver for driving a gate of said at least one power switching device;

providing interconnection across the power board and the driver board, thereby at least mechanically connecting the power board and the driver board together;

providing a lead frame and mounting said at least mechanically connected power board and driver board onto the lead frame; and moulding a package upon said at least mechanically connected power board and driver board mounted on the lead frame.

Preferably, the power board includes a substrate which is of a thermally conducting and electrically insulating material, such as ceramic material, and is provided with direct bond copper, and the driver board includes a printed circuit board, and the manufacturing method includes using at least one of the direct bond copper and the printed circuit board to provide the interconnection.

In a preferred embodiment, the manufacturing method includes using the printed circuit board to provide the interconnection, the printed circuit board including at least one aperture in which the or a respective substrate is located.

More preferably, the manufacturing method includes covering the direct bond copper over and extending it beyond said at least one aperture.

In a preferred embodiment, the manufacturing method includes extending the direct bond copper from the substrate to reach and connecting it with the printed circuit board, thereby providing the interconnection.

In a preferred embodiment, the manufacturing method includes using a flexible flat connector, such as a flexible PCB or flat cable, to provide the interconnection which mechanically connects the power board and the driver board and electrically connects components on the power board and the driver board.

BRIEF DESCRIPTION OF DRAWINGS

The invention will now be more particularly described, by way of example only, with reference to the accompanying drawings, in which.

DETAILED DESCRIPTION OF PREFERRED EMBODIMENTS

Figure 1:
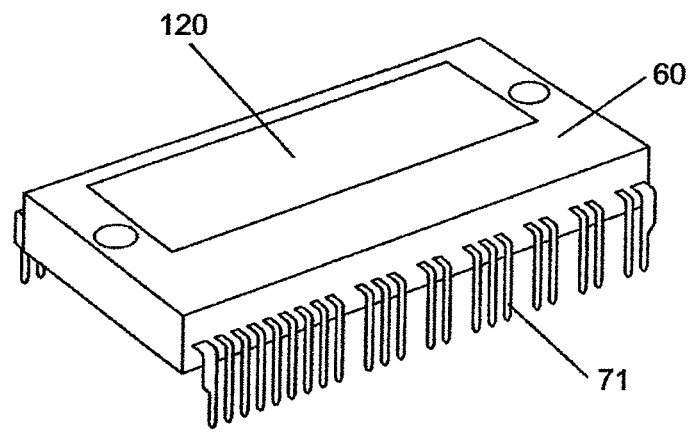
FIG. 1 is a perspective view of an integrated power module generally known in the art.
Figure 2:
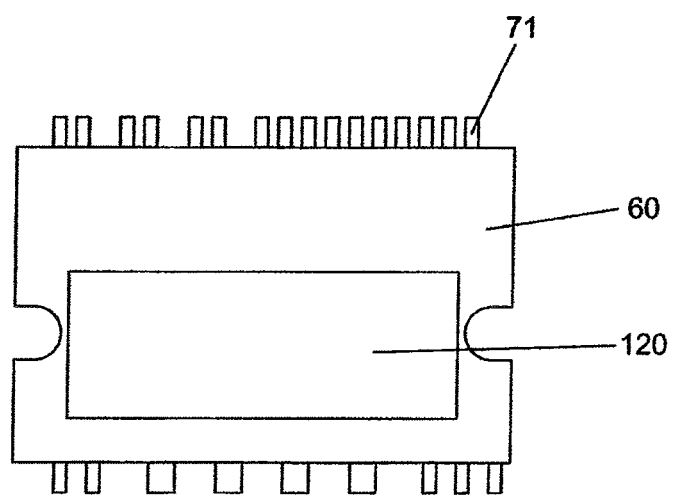
FIG. 2 is a top plan view of the integrated power module of FIG. 1.
Figure 3:
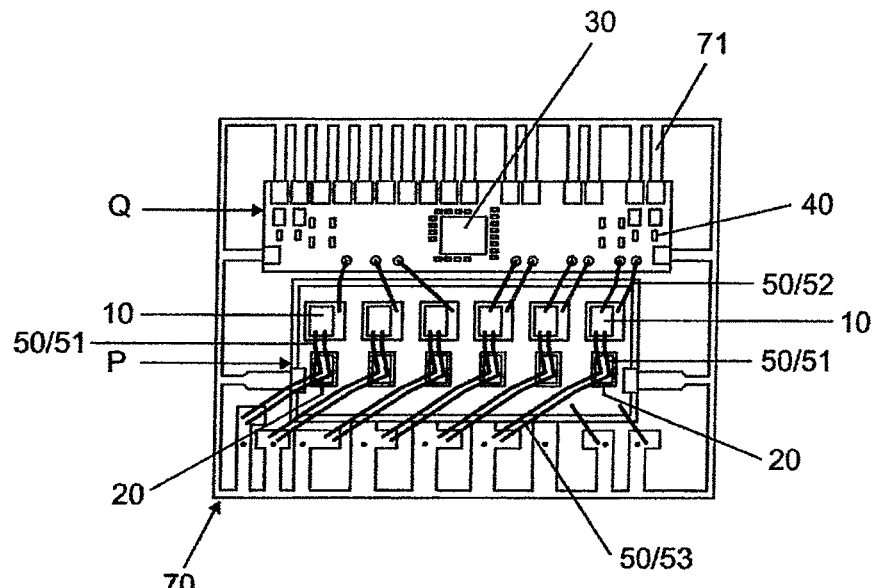
FIG. 3 is a bottom plan view of the internal components of the integrated power module of FIG. 1.
Figure 4:
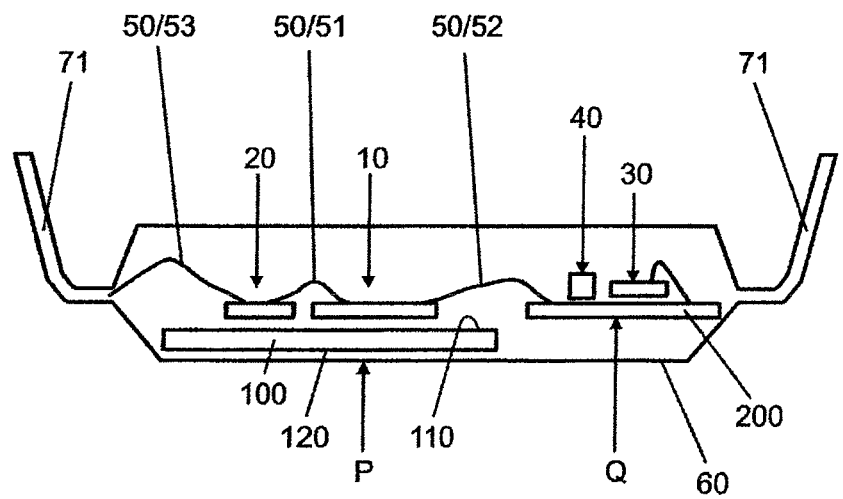
FIG. 4 is a cross-sectional side view of the internal components of the integrated power module of FIG. 3.
Figure 5A:
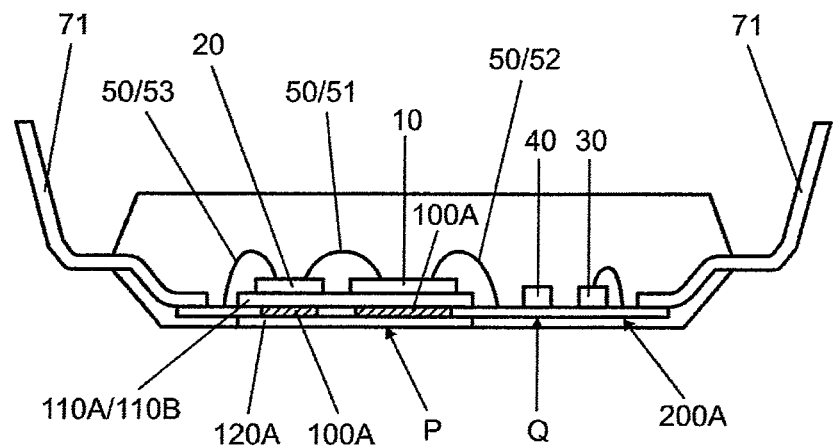
FIG. 5A is a cross-sectional side view of a first embodiment of an integrated power module in accordance with the invention, including a composite PCB.
Figure 5B:
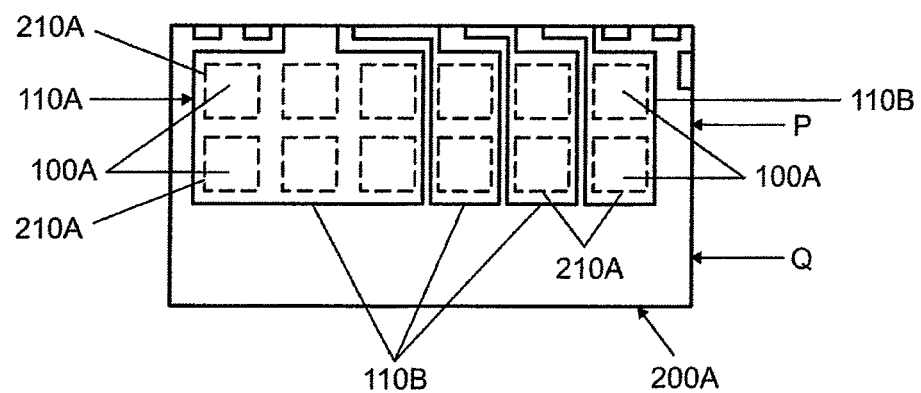
FIG. 5B is a bottom plan view showing brief construction of the composite PCB of FIG. 5A.

Referring now to FIGS. 5A and 5B, there is shown a first embodiment of an IPM in accordance with the invention, which shares the same general construction and most key components as the prior art IPM described above, except otherwise described. In this IPM, a composite PCB 200A is used in place of the PCB 200 described above. The composite PCB 200A may be made of the same normal substrate material (typically FR-4 glass epoxy) as previously stated, but it is made larger than the PCB 200, with a size covering the combined footprint of the power board P and driver PCBA Q in order to act as a support for both of these two units.

The composite PCB 200A is formed with a plurality of apertures 210A which are filled with materials or, more specifically as in this embodiment, in which respective slabs or plates 100A of a matching shape are located, at or over the regions where the power switching devices 10 and reverse current circulating diodes 20 are to be mounted. Such materials or the materials making the plates 100A are of high thermal conductive and high electrical insulating characteristics, and are preferably ceramic materials and/or typically aluminium oxide.

In addition, direct bond copper (DBC) is provided or deposited to cover both sides at or over the regions, covering and extending beyond the apertures 210A, for the power switching devices 10 and reverse current circulating diodes 20, with the copper 110A on the first side bearing an etched pattern to provide mounting pads 110B and connections for the power switching devices 10 and the reverse current circulating diodes 20, and the copper 120A on the opposite second side exposed and acting as a heat sink. The DBC copper 110A on the first side is made in the form of a plurality of separate or discrete copper pads 110B, each pad 110B being for mounting of and sharing by at least one pair of the power switching device 10 and reverse current circulating diode 20. The DBC copper 120A on the second side remains a one-piece structure for heat dissipation.

As to the mounting of the power switching devices 10 and reverse current circulating diodes 20, instead of mounting these chips with their chip substrates against the appropriate copper pads 110B on the DBC, it is preferred that flip chip manufacturing technology be employed which enables connection of the two connection terminals on the top side of the power switching devices 10 directly to the appropriate DBC copper pads 110B. In doing so, the number of connections subsequent to the attachment of the power switching devices 10 onto the composite PCB 200A is reduced from two to one per device 10.

Dependent upon the design of the IPM circuit, more than one pair, for example three pairs of the power switching devices 10 and reverse current circulating diodes 20 may be mounted on and connected to an enlarged DBC copper pad 110B, as shown on the left side of FIG. 5B.

As in the described embodiment, there are typically six power switching devices 10 and hence the total number of connections after they have been attached onto the composite PCB 200A is reduced from twelve to six. More preferably, in the case where the power switching devices 10 have all their connection pads available or accessible on the front side, for example if lateral MOSFETs or lateral IGBTs are used, the bonding wires to such power switching devices 10 can be minimized or eliminated.

The connection to the substrate side of power switching devices 10 and reverse current circulating diodes 20 may be effected by way of bonding, e.g. using bond wires, as is generally known in the art, or alternatively or optionally by employing chip technology or any other suitable connection means.

Whilst a portion of the composite PCB 200A, over about half of its area, is utilized in the making of the power board P, the remaining portion is taken up by the driver PCBA Q, whose PCB copper pattern is generally known and hence omitted in FIG. 5B for clarity. The gate driver IC(s) 30 may be connected to the composite PCB 200A preferably by flip chip technology to minimize or eliminate all bonding wires, or alternatively or optionally by bonding or using bond wires.

It is important to note that, since the complete circuit of the IPM is built on a single composite PCB 200A in a one-piece structure with sufficient rigidity to withstand normal handling (i.e. without fear of damage being caused), all the electrical interconnection can be made and completed, including in particular the electrical connection across the power board P and the driver PCBA Q (i.e. the bonding wires 52 described above), prior to mounting of the composite PCB 200A (carrying the power board P and the driver PCBA Q) onto the lead frame 70.

It is no longer necessary to rely on the lead frame 70 to support and locate the power board P and the driver PCBA Q in a fixed relationship prior to interconnection of the various components and in particular the power board P and the driver PCBA Q of the IPM circuit. Hence, the lead frame 70 may be assembled at a later stage.

Up to this stage of the described manufacturing method, it is an advantage that the number of bonding or bond wires used is greatly reduced, whereby the reliability of the composite PCBA 200A is significantly improved.

More importantly, since the entire IPM circuit can now be completed and interconnected properly on the composite PCB 200A prior to mounting of the IPM circuit onto the lead frame 70, all necessary functional and parametric tests can be carried out for quality control. This will ensure a higher yield for the subsequent semiconductor package moulding process and trimming and forming operations, which are to be carried out in the way as is generally known in the art.

Figure 6A:
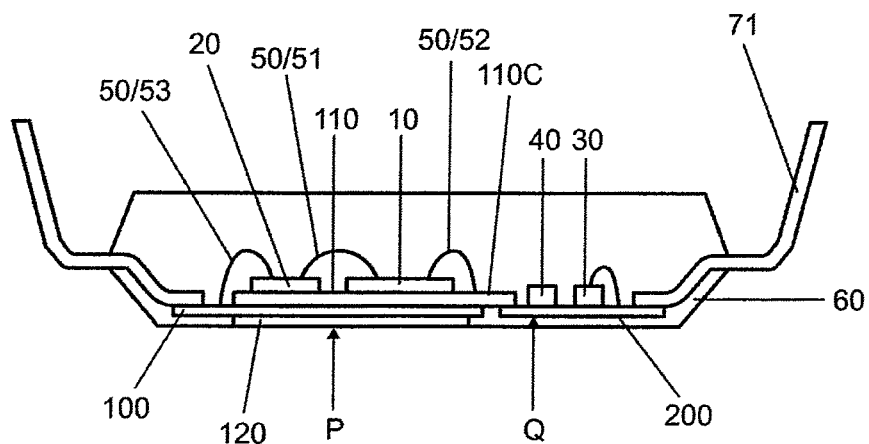
FIG. 6A is a cross-sectional side view of a second embodiment of an integrated power module in accordance with the invention, including a power board and a driver PCBA.
Figure 6B:
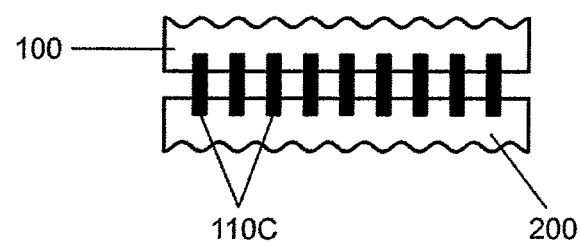
FIG. 6B is a fragmentary bottom plan view showing interconnection between the power board and driver PCBA of FIG. 6A.

Referring then to FIGS. 6A and 6B, there is shown a second embodiment of an IPM in accordance with the invention, which shares the same general construction and most key components as the prior art IPM described above, except otherwise described.

In this IPM, the copper 110 of the DBC on the first side of the ceramic substrate 100 are formed integrally with one or a plurality of extensions or fingers 110C which extend from the ceramic substrate 100 of the power board P to reach and overlap with the etched copper pattern on the PCB 200 of the driver PCBA Q. The fingers 110C are then fixedly connected, e.g. by soldering or bonding, with a dedicated copper part, in the form of for example a copper rail, which extends along an adjacent side of the PCB 200. Such a copper rail may be additional to or a part of the copper pattern on the PCB 200.

The fingers 110C bridge across the power board P and the driver PCBA Q and connect these two units mechanically together into a one-piece structure. The fingers 110C are of sufficient rigidity or strength to withstand normal handling (i.e. without fear of fracture) of the assembly of interconnected power board P and driver PCBA Q. With this mechanical connection, all the electrical interconnection can be made and completed, including in particular the electrical connection across the power board P and the driver PCBA Q (i.e. the bonding wires 52 described above), prior to mounting of the assembly onto the lead frame 70. In addition, all necessary functional and parametric tests can be carried out for quality control, prior to mounting of the lead frame 70 and in particular moulding of the semiconductor package 60, etc.

Figure 7A:
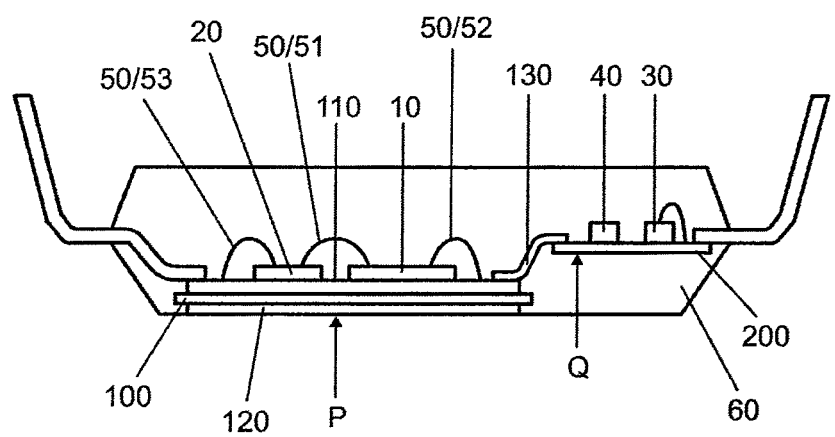
FIG. 7A is a cross-sectional side view of a third embodiment of an integrated power module in accordance with the invention, including a power board and a driver PCBA.
Figure 7B:
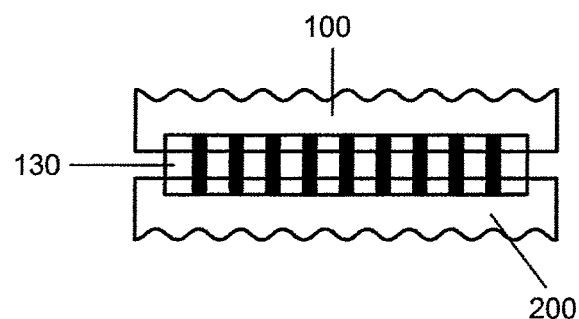
FIG. 7B is a fragmentary bottom plan view showing interconnection between the power board and driver PCBA of FIG. 7A.

Referring finally to FIGS. 7A and 7B, there is shown a third embodiment of an IPM in accordance with the invention, which shares the same general construction and most key components as the prior art IPM described above, except otherwise described.

In this IPM, the electrical interconnection between the power board P and the driver PCBA Q is implemented by using a flexible flat connector 130, for example in the form of a flexible PCB or flat cable, which has a plurality (i.e. row) of electrically-conductive tracks or cores replacing the fingers 110C extending from the ceramic substrate 100 of the power board P of the second embodiment described above.

The flexible flat connector 130 bridges across the power board P and the driver PCBA Q and connects these two units mechanically together to form a one-piece structure, with at least some of its cores electrically connecting the circuits of the respective units. Although the flexible flat connector 130 is not rigid, it is of sufficient strength to withstand normal handling (i.e. without fear of breakage) of the assembly of interconnected power board P and driver PCBA Q. With this mechanical connection, all the electrical interconnection can be made and completed prior to mounting of the assembly onto the lead frame 70. Also, all necessary functional and parametric tests can be carried out for quality control, prior to mounting of the lead frame 70 and in particular moulding of the semiconductor package 60, etc.

It is envisaged that the ceramic substrate 100 of the power board P of the described embodiments may be replaced by a metal core board, such as aluminum or copper core board, also commonly known as aluminum or copper based PCB, which includes a metal sheet laminated with a thin thermally-conductive thin dielectric and then copper tracks. The metal sheet acts as a heat sink for components requiring significant cooling, e.g. power switches in the present case.

The invention has been given by way of example only, and various other modifications of and/or alterations to the described embodiments may be made by persons skilled in the art without departing from the scope of the invention.

The invention claimed is:

1. An integrated power module comprising:
    a composite printed circuit board having opposed first and second sides and including a first area and a second area, wherein the composite printed circuit board includes at least one aperture extending through the composite printed circuit board, from the first side to the second side, in the second area;
    at least one driver mounted on the first side of the composite printed circuit board in the first area;
    at least one power switching device mounted on the first side of the composite printed circuit board in the second area, wherein
        the at least one driver is connected for driving a gate of the at least one power switching device; and
        a respective aperture, of the at least one aperture in the composite printed circuit board, is located directly opposite each of the at least one power switching device;
    directly bonded copper disposed on the first side of the composite printed circuit board, in the second area, and providing electrical connections to the at least one power switching device;
    a lead frame to which the composite printed circuit board is mounted; and
    a package encapsulating the composite printed circuit board, the at least one power switching device, and the at least one driver.

2. The integrated power module as claimed in claim 1, further including at least one substrate of a thermally conducting and electrically insulating material and disposed in each respective aperture, wherein the directly bonded copper is disposed in each respective aperture and on the second side of the composite printed circuit board as a heat sink, and the directly bonded copper provides electrical interconnection of the at least one power switching device and the at least one driver.

3. The integrated power module as claimed in claim 2, wherein the directly bonded copper covers and extends beyond the at least one aperture.

4. The integrated power module as claimed in claim 2, wherein the directly bonded copper extends from the substrate, reaches, and is connected to, the first side of the composite printed circuit board.

5. The integrated power module as claimed in claim 2, wherein the thermally conducting and electrically insulating material comprises a ceramic material.

6. An integrated power module comprising:
a power board including a ceramic circuit board having opposed first and second sides, at least one power switching device mounted on the first side of the ceramic circuit board, and directly bonded copper disposed on the first side of the ceramic circuit board;
a driver board including a printed circuit board having opposed first and second sides, and at least one driver mounted on the first side of the printed circuit board and connected for driving a gate of the at least one power switching device, wherein the directly bonded copper includes a plurality of fingers projecting beyond the ceramic circuit board and bonded to the first side of the printed circuit board, providing a mechanical connection of the printed circuit board to the ceramic circuit board;
a lead frame to which the power board and the driver board are mounted; and
a package encapsulating the power board and the driver board.

7. An integrated power module comprising:
a power board including a ceramic circuit board having opposed first and second sides, at least one power switching device mounted on the first side of the ceramic circuit board, and directly bonded copper disposed on the first side of the ceramic circuit board;
a driver board including a printed circuit board having opposed first and second sides, and at least one driver mounted on the first side of the printed circuit board and connected for driving a gate of the at least one power switching device;
a flexible flat connector including a plurality of electrical conductors, wherein
the flexible flat connector is attached at a first end to the directly bonded copper on the first side of the ceramic circuit board,
the flexible flat connector is attached at a second end to the first side of the printed circuit board, and
the flexible flat connector provides a mechanical interconnection of the printed circuit board to the ceramic circuit board;
a lead frame to which the power board and the driver board are mounted; and
a package encapsulating the power board and the driver board.

8. The integrated power module as claimed in claim 7, wherein the flexible flat connector electrically connects the power board to the driver board.

9. The integrated power module as claimed in claim 8, wherein the flexible flat connector is a flexible printed circuit board or a flat cable.

* * * * *